(12) United States Patent
Wong et al.

(10) Patent No.: US 7,812,757 B1
(45) Date of Patent: Oct. 12, 2010

(54) HYBRID ANALOG-TO-DIGITAL CONVERTER (ADC) WITH BINARY-WEIGHTED-CAPACITOR SAMPLING ARRAY AND A SUB-SAMPLING CHARGE-REDISTRIBUTING ARRAY FOR SUB-VOLTAGE GENERATION

(75) Inventors: Yat To William Wong, Hong Kong (HK); Kam Chuen Wan, Hong Kong (HK); Kwok Kuen David Kwong, Davis, CA (US)

(73) Assignee: Hong Kong Applied Science and Technology Research Institute Co., Ltd., Hong Kong (HK)

( * ) Notice: Subject to any disclaimer, the term of this patent is extended or adjusted under 35 U.S.C. 154(b) by 7 days.

(21) Appl. No.: 12/483,250

(22) Filed: Jun. 12, 2009

(51) Int. Cl.
*H03M 1/12* (2006.01)
(52) U.S. Cl. ...................... 341/172; 341/155
(58) Field of Classification Search .......... 341/155–172
See application file for complete search history.

(56) References Cited

U.S. PATENT DOCUMENTS

| 5,684,487 | A | 11/1997 | Timko |
| 6,118,400 | A | 9/2000 | Susak |
| 6,400,302 | B1 | 6/2002 | Amazeen et al. |
| 7,105,921 | B2 * | 9/2006 | Farnworth et al. .......... 257/701 |
| 7,372,384 | B1 * | 5/2008 | Xu .............................. 341/143 |
| 7,486,217 | B2 * | 2/2009 | Matsushita et al. .......... 341/161 |
| 7,504,977 | B2 * | 3/2009 | Doorenbos et al. .......... 341/143 |
| 7,733,261 | B2 * | 6/2010 | Bhakta et al. ................ 341/155 |

OTHER PUBLICATIONS

Alpman et al. "A 1.1V 50mW 2.5GS/s 7b Time-Interleaved C-2C SAR ADC in 45nm LP Digital CMOS", ISSCC 2009 / Session 4 / High-Speed Data Converters / 4.2, Feb. 9, 2009.

* cited by examiner

*Primary Examiner*—Lam T Mai
(74) *Attorney, Agent, or Firm*—gPatent LLC; Stuart T. Auvinen (57) ABSTRACT

A hybrid Analog-to-Digital Converter (ADC) has a binary-weighted capacitor array and a sub-voltage capacitor array that are coupled together by a coupling capacitor. The sub-voltage capacitor array uses a minimum capacitor size that matches the minimum capacitor size of the binary-weighted capacitor array. The coupling capacitor is double the minimum size and reduces a voltage effect on a charge sharing line by half. Second coupling capacitors in the sub-voltage capacitor array each reduce the voltage effect by half, so that first, second, and third sub-voltage capacitors in the sub-voltage capacitor array produce ½, ¼, and ⅛ voltage swings using the minimum size capacitance. Only MSB capacitors in the binary-weighted capacitor array sample the analog input voltage. During conversion, MSB's from a Successive-Approximation-Register (SAR) are applied to binary-weighted capacitors while LSB's are applied to sub-voltage capacitors. The total capacitance is reduced by applying the LSB's only to the sub-voltage capacitor array.

20 Claims, 9 Drawing Sheets

STATE S2: CONVERT

HYBRID ANALOG-TO-DIGITAL CONVERTER (ADC) WITH BINARY-WEIGHTED-CAPACITOR SAMPLING ARRAY AND A SUB-SAMPLING CHARGE-REDISTRIBUTING ARRAY FOR SUB-VOLTAGE GENERATION

FIELD OF THE INVENTION

This invention relates to analog-to-digital converters (ADC), and more particularly to successive-approximation register (SAR) ADC's with hybrid capacitor arrays.

BACKGROUND OF THE INVENTION

Larger system chips often include analog as well as digital circuits. Signals may cross from the digital domain to the analog domain, and vice-versa. Analog signals may be converted to digital for complex digital processing, such as by a Digital Signal Processor (DSP).

Many types of Analog-to-Digital Converters (ADC's) have been used for a wide variety of applications. Flash ADC's compare analog signal voltages to multiple voltage levels in an instant to produce a multi-bit digital word that represents the analog voltage. Successive-approximation ADC's use a series of stages to convert an analog voltage to digital bits. Each stage compares an analog voltage to a reference voltage, producing one digital bit. In sub-ranging ADC's, each stage compares an analog voltage to several voltage levels, so that each stage produces several bits. Succeeding stages generate lower-significant digital bits than do earlier stages in the pipeline.

Algorithmic, re-circulating, or recycling ADC's use a loop to convert an analog voltage. The analog voltage is sampled and compared to produce a most-significant digital bit. Then the digital bit is converted back to analog and subtracted from the analog voltage to produce a residue voltage. The residue voltage is then multiplied by two and looped back to the comparator to generate the next digital bit. Thus the digital bits are generated over multiple cycles in the same comparator stage.

Figure 1:
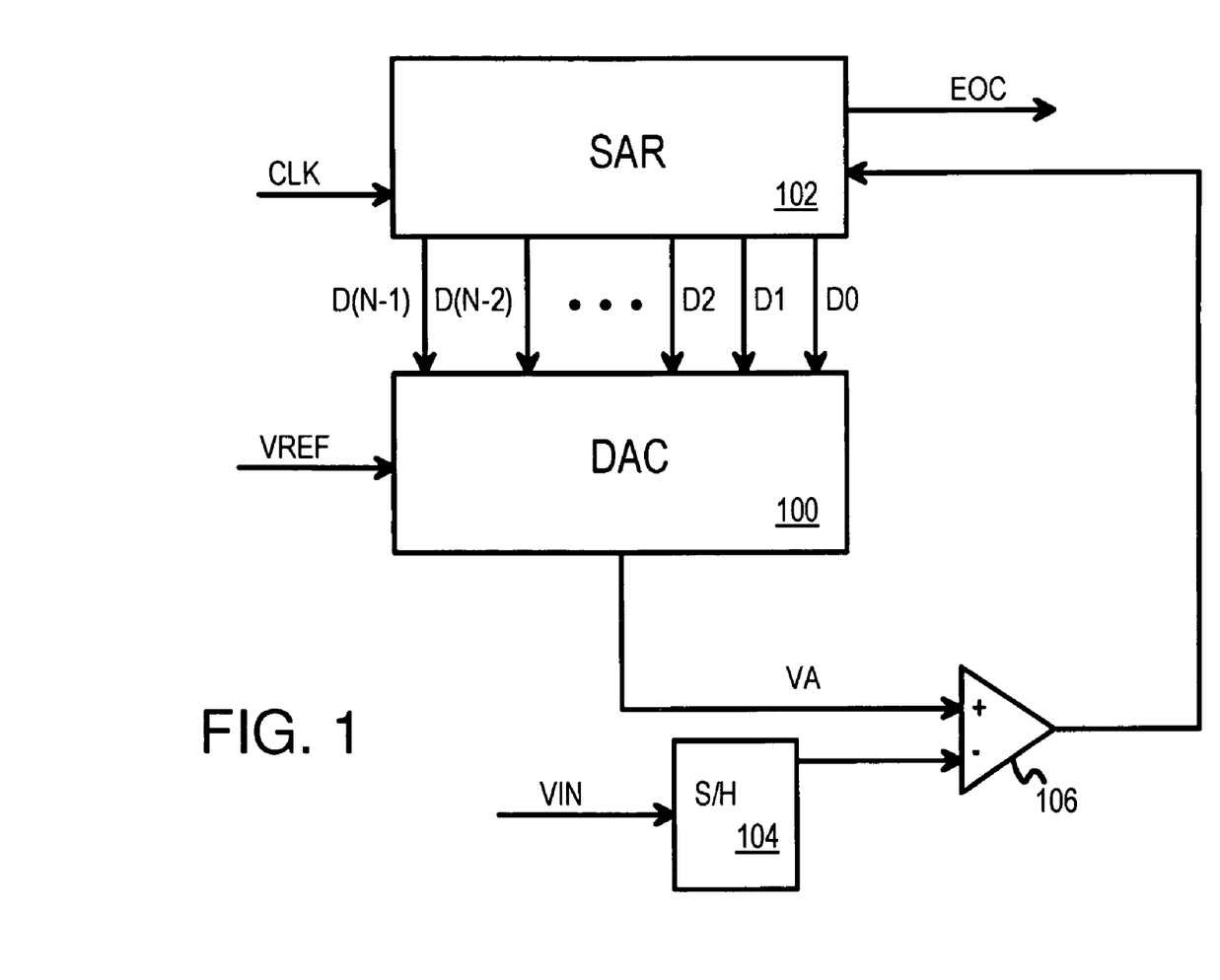
FIG. 1 shows a Successive-Approximation-Register ADC.

FIG. 1 shows a Successive-Approximation-Register ADC. Successive-Approximation-Register SAR 102 receives a clock CLK and contains a register value that is changed to gradually zero-in on a close approximation of the analog input voltage VIN. For example, the value in SAR 102 may first be 0.5, then 0.25, then 0.375, then 0.312, then 0.281, then 0.296, then 0.304, then 0.308, then 0.31, then 0.311, and finally 0.312 when comparing to a VIN of 0.312 volts. SAR 102 outputs the current register value to digital-to-analog converter (DAC) 100, which receives a reference voltage VREF and converts the register value to an analog voltage VA.

The input analog voltage VIN is applied to sample-and-hold circuit 104, which samples and holds the value of VIN. For example, a capacitor can be charged by VIN and then the capacitor isolated from VIN to hold the analog voltage. The sampled input voltage from sample-and-hold circuit 104 is applied to the inverting input of comparator 106. The converted analog voltage VA is applied to the non-inverting input of comparator 106.

Comparator 106 compares the converted analog voltage VA to the sampled input voltage and generates a high output when the converted analog voltage VA is above the sampled VIN, and the register value in SAR 102 is too high. The register value in SAR 102 can then be reduced.

When the converted analog voltage VA is below the sampled input voltage, comparator 106 generates a low output to SAR 102. The register value in SAR 102 is too low. The register value in SAR 102 can then be increased for the next cycle.

The register value from SAR 102 is a binary value of N bits, with D(N−1) being the most-significant-bit (MSB) and D0 being the least-significant-bit (LSB). SAR 102 can first set the MSB D(N−1), then compare the converted analog voltage VA to the input voltage VIN, then adjust the MSB and/or set the next MSB D(N−2) based on the comparison. The set and compare cycle repeats until after N cycles the LSB is set. After the last cycle, the end-of-cycle EOC signal is activated to signal completion. A state machine or other controller can be used with or included inside SAR 102 to control sequencing.

DAC 100 or sample-and-hold circuit 104 may have an array of capacitors. The capacitors have binary-weighted values, such as 1, 2, 4, 8, 16, 32, . . . times a minimum capacitor size. For example, a 6-bit DAC may have an array of capacitors of 1, 2, 4, 8, 16, 32 times a minimum capacitance C. Higher-resolution DAC's such as a 11-bit DAC have much larger capacitor values, such as $2^{N-1}=1024$.

While such capacitor-array DAC's are useful, the large size of the MSB capacitors requires a large amount of charge to be transferred. The total capacitance Ct of a binary-weighted capacitor array is $2^N*C$, where N is the number of binary bits and C is the capacitance of the minimum capacitor.

The dynamic power requirements of the DAC portion of the ADC increase as total capacitance Ct of the capacitor array increases, since dynamic power is $f*Ct*V^2$ for a frequency f and a voltage swing V.

The minimum capacitor size C can be shrunk to reduce the overall capacitance of the capacitor array and thus reduce the dynamic power requirements. The minimum capacitor size may be restricted by the process technology. For example, a sub-micron process may allow for a 4×4 μm2 minimum physical-size for a metal-to-metal capacitor, which has a capacitance of about 16 fF.

The minimum total capacitor size for sample and hold switches used in a data converter is limited by the thermal noise (KT/C), which must be smaller than the quantization noise $$\left(\frac{\Delta^2}{12} = (Vdd/2^N)^2/12\right),$$

where N is the number of bits, and Vdd is the power supply voltage. For example, a 1V supply, 12-bit ADC has a quantization noise of about 5E-9, and thus the required capacitor for thermal noise is much larger than 0.805 pF, so that the thermal noise is lower than the quantization noise.

The quantization noise limit $$\left(\frac{\Delta^2}{12}\right)$$

can be increased by reducing the number of bits in the capacitor array. For example, a 1V supply, 10-bit array has a quantization noise limit of 79.5 $nV^2$, while an 8-bit ADC has a quantization noise about 1.27 $uV^2$. Although thermal noise is increased by removing MSBs from the binary-weighted capacitor array, the total capacitor size can be reduced significantly. For an example, when the 2 MSB capacitors are removed, which are the largest capacitors, Ct drops from $2^{12}$ to $2^{10}$ C. Thus smaller binary-weighted capacitor arrays have lower capacitance due to removing the MSB capacitors.

Thermal noise is increased by removing the MSBs from the binary-weighted capacitor array until the thermal noise contributed by the capacitors is slight less than or reaches the theoretical limit of quantization noise of the required resolution.

What is desired is an ADC with reduced total capacitance to reduce dynamic power. A capacitor array for a SAR ADC is desirable that has a smaller binary-weighted capacitor array to reduce capacitance, yet still achieves a target resolution. An ADC with both a reduced-size binary-weighted capacitor array and a sub-voltage capacitor array is desirable.

DETAILED DESCRIPTION

The present invention relates to an improvement in Analog-to-Digital Converters (ADC). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that reducing the number of bits in a binary-weighted capacitor array reduces the total capacitance and dynamic power. However, the reduced number of bits also reduces the resolution.

The inventors have realized that a combination of a binary-weighted capacitor array and a non-weighted capacitor array can provide a desired resolution while still reducing total capacitance and dynamic power. The binary-weighted capacitor array and the non-weighted capacitor array are connected by a coupling capacitor. The size of the coupling capacitor is double the minimum capacitor size, so that the voltages coupled from the non-weighted capacitor array are halved as they pass through the coupling capacitor. The non-weighted capacitor array is thus a sub-voltage capacitor array.

A reduced binary-weighted capacitor array determines the minimum capacitor size. Then this minimum capacitor size is used in the sub-voltage capacitor array that has all switched capacitors with the same minimum capacitor value. The switched capacitors are separated from the binary-weighted capacitor array by a 2C coupling capacitor. Since the coupling capacitor has a double capacitance value, the switched capacitors have an effect of half or less of the minimum capacitor size of the binary-weighted capacitor array. Thus the sub-voltage capacitor array acts as binary bits with a higher resolution, with a significance that is less than the LSB (minimum capacitor) of the binary-weighted capacitor array.

Within the sub-voltage capacitor array, sub-voltage capacitors are separated from each other by other coupling capacitors, each with a value of 2C. Thus each successive sub-voltage capacitor has an effect of ½ of the prior sub-voltage capacitor. Successive sub-voltage capacitors have effective values of ½, ¼, ⅛, 1/16, etc. of the minimum capacitor in the binary-weighted capacitor array.

Figure 2:
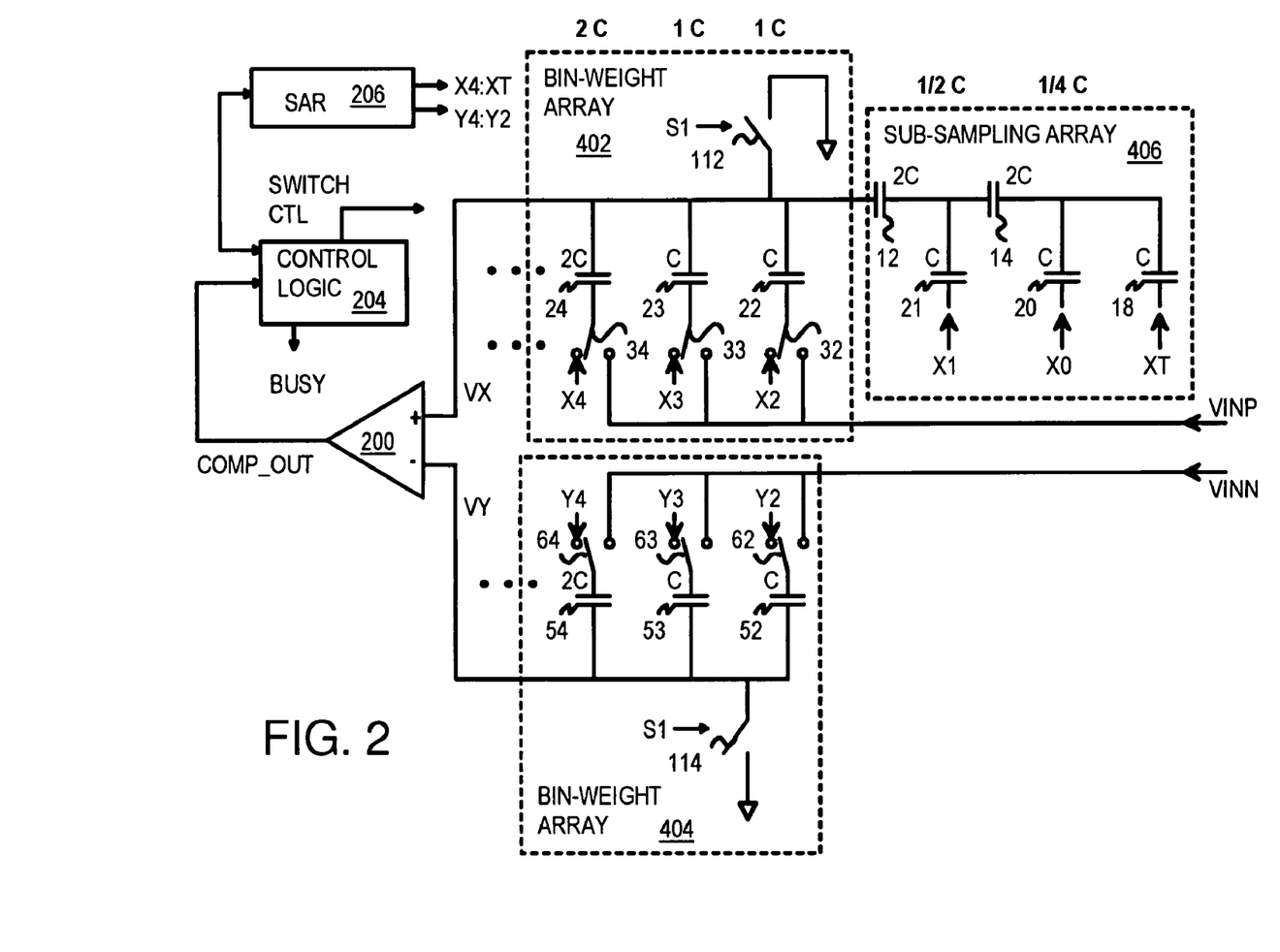
FIG. 2 is a diagram of a SAR ADC with a reduced binary-weighted capacitor array and a sub-voltage capacitor array.

FIG. 2 is a diagram of a SAR ADC with a reduced binary-weighted capacitor array and a sub-voltage capacitor array. Binary-weighted capacitor arrays 402, 404 each have fewer bits than the resolution of the ADC. The resolution of the ADC is determined by the number of binary bits stored in Successive-Approximation-Register (SAR) 206. For example, SAR 206 may store 5 bits, but binary-weighted capacitor arrays 402, 404 each receive only 3 bits. The other 2 bits from SAR 206 are sent to sub-voltage capacitor array 406.

The most-significant-bits (MSBs) of SAR 206 are applied to binary-weighted capacitor arrays 402, 404, while the least-significant-bits (LSBs) from SAR 206 are applied to sub-voltage capacitor array 406.

Since binary-weighted capacitor arrays 402, 404 only receive the MSB's, the size of binary-weighted capacitor arrays 402, 404 are reduced compared to the number of bits of resolution in SAR 206. When the 2 LSB's are applied to sub-voltage capacitor array 406, the number of binary bits of binary-weighted capacitor arrays 402, 404 is reduced by 2. The two largest capacitors are removed from binary-weighted capacitor arrays 402, 404, cutting capacitance significantly.

Binary-weighted capacitor array 402 has switches 32, 33, 34 that switch input voltage VINP to the bottom plate of capacitors 22, 23, 24 during a first sampling phase, and switch MSB bits X2, X3, X4 from SAR 206 during a conversion phase. Grounding switch 112 closes during sampling phase S1 and is open during conversion phase S2. The top plates of capacitors 22, 23, 24 are connected to the non-inverting input of comparator 200 and generate voltage VX. Capacitors 23, 24, . . . increase in binary weights or multiples of the minimum capacitor size C, with capacitance C for capacitor 23, capacitance 2C for capacitor 24, then capacitances of 4C, 8C, 16C, 32C, 64C, . . . for successive capacitors (not shown). Capacitors 22, 23 both have the minimum capacitor size of C. Capacitor 22 acts as a surrogate termination capacitor that transfers charge during the conversion phase.

The LSB's from SAR 206 are applied to the bottom plates of sub-voltage capacitors 18, 20, 21 in sub-voltage capacitor array 406 during the conversion phase S2. The bottom plates are grounded during the sampling phase S1. Switches (not shown) may be used, or SAR 206 may output ground signals for X1, X0, XT during sampling phase S1. Control logic 204 can generate control signals such as S1, S2 and adjust values in SAR 206 in response to compare results from comparator 200. Once all bits in SAR 206 have been adjusted, a busy signal can be negated to indicate that conversion is complete.

Coupling capacitor 12 couples sub-voltage capacitor array 406 to the top plates of capacitors 22, 23, 24 in binary-weighted capacitor array 402. The minimum capacitor size C is used for capacitors 22, 23 in binary-weighted capacitor array 402, and for sub-voltage capacitors 18, 20, 21 in sub-voltage capacitor array 406. However, since coupling capacitor 12 as a double-capacitance value of 2C, the effective capacitance of sub-voltage capacitor 21 is half of the nominal capacitance, or ½ C. When X1 swings by 1 volt, a charge of only 0.5° C. is moved through coupling capacitor 12 to node VX. Thus the voltage swings of sub-voltage capacitor 21 are halved by coupling capacitor 12. A capacitance of C produces only 0.5C of effect on VX.

Second coupling capacitor 14 is coupled between sub-voltage capacitors 20, 21. Second coupling capacitor 14 also reduces the voltage effect by half. Thus when X0 applied to the bottom plate of sub-voltage capacitor 20 swings by 1 volt, a charge of only 0.5° C. is moved through second coupling capacitor 14. Then only half of this charge is moved through coupling capacitor 12 to node VX. Thus the voltage swings of sub-voltage capacitor 20 are quartered by coupling capacitors 12, 14. A capacitance of C produces only 0.25C of effect on VX. The effective capacitance of sub-voltage capacitor 20 is one-quarter of the nominal capacitance, or ¼ C.

These effective capacitances are shown above capacitors 24, 23, 22, 21, 20 as 2C, C, C in binary-weighted capacitor array 402 and ½ C, ¼ C in sub-voltage capacitor array 406. Although the minimum capacitor size is C, an effective capacitor size of one-quarter C is available. The total capacitance in binary-weighted capacitor array 402 generated by the aforesaid minimum capacitor size C can be set by the requirement of thermal noise which is less than the quantization noise of the data converter. For example, when M is the total resolution stored in SAR 206 and 2 LSB's are applied to sub-voltage capacitor array 406 and only M-2 bits are applied to binary-weighted capacitor array 402. Thus the total capacitance is reduced, reducing dynamic power.

Sub-voltage capacitor 18 acts as a termination capacitor during conversion phase S2 while capacitor 22 acts as a surrogate capacitor during sampling phase S1. Capacitor 52 also acts as termination for binary-weighted capacitor array 404.

Binary-weighted capacitor array 404 has switches 62, 63, 64 that switch input voltage VINN to the bottom plate of capacitors 52, 53, 54 during a first sampling phase, and switch MSB bits Y2, Y3, Y4 from SAR 206 during a conversion phase. Grounding switch 114 closes during sampling phase S1 and is open during conversion phase S2. The top plates of capacitors 52, 53, 54 are connected to the inverting input of comparator 200 and generate voltage VY. Capacitors 53, 54, . . . increase in binary weights or multiples of the minimum capacitor size C, with capacitance C for capacitor 53, capacitance 2C for capacitor 54, then capacitances of 4C, 8C, 16C, 32C, 64C, . . . for successive capacitors (not shown). Capacitors 52, 53 both have the minimum capacitor size of C. Capacitor 52 acts as a termination capacitor that transfers charge during the conversion phase.

A differential analog input voltage is applied to inputs VINP, VINN. If a single-ended analog voltage were used, it could be applied to VINP and a fixed voltage such as ground or VDD/2 could be applied to VINN. Binary-weighted capacitor arrays 402, 404 can act as sample-and-hold circuit 104 while binary-weighted capacitor array 402, 404 and sub-voltage capacitor array 406 act as DAC 100 of FIG. 1.

SAR 206 can store 2 copies of each MSB, such as X4 and Y4, or these can be the same bit or be adjusted such as by a calibration value. Y4 and X4 can be the same value during the conversion; however, Y4 and X4 will become 1 and 0 pairs or 0 and 1 pairs after the comparison decision has been made by the control logic. This is because this architecture is used for fully differential inputs in which signal of inputs are swing differentially.

Figure 3A:
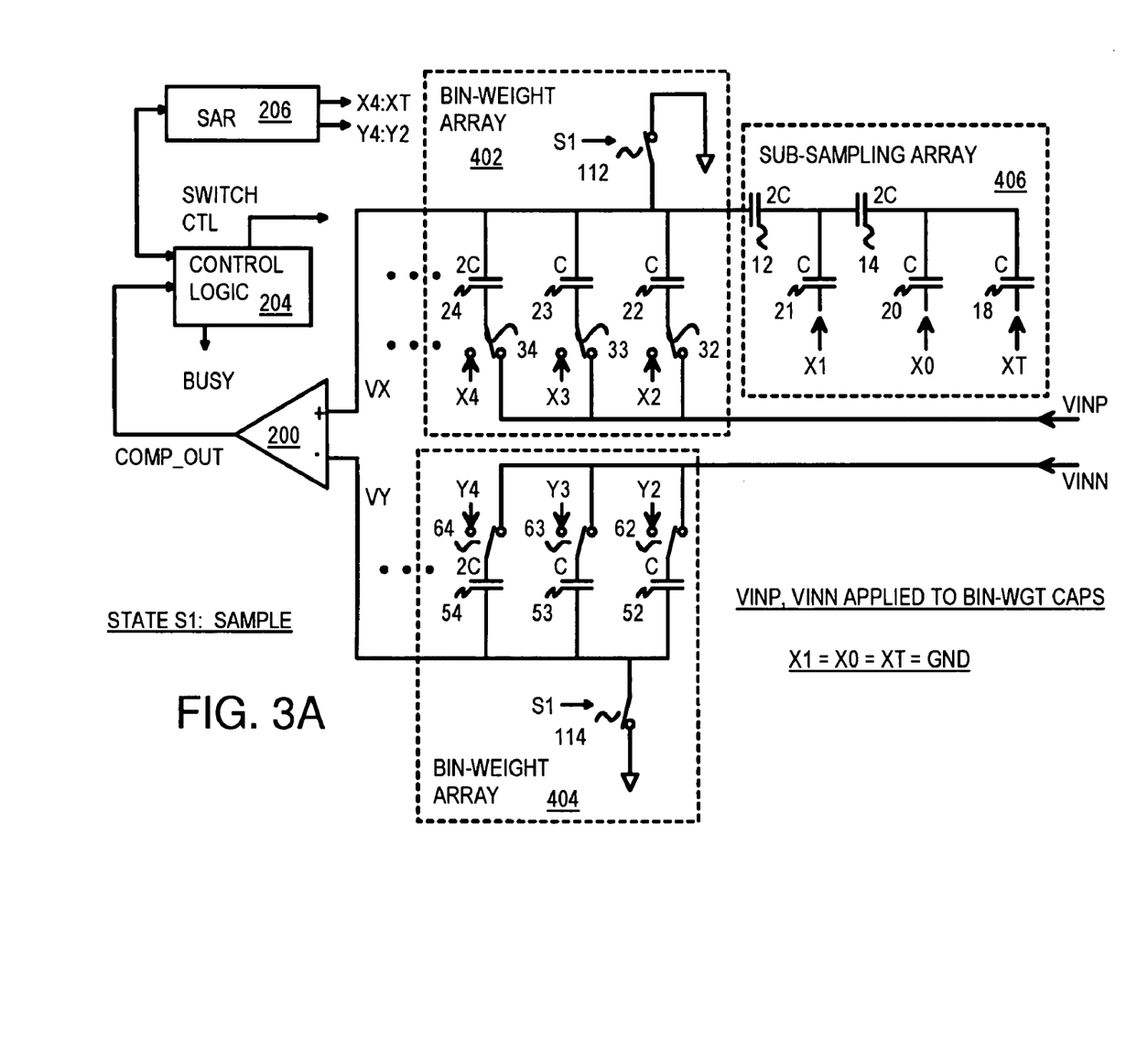
FIGS. 3A-B highlight operation of the SAR ADC with a reduced binary-weighted capacitor array and a sub-voltage capacitor array.
Figure 3B:
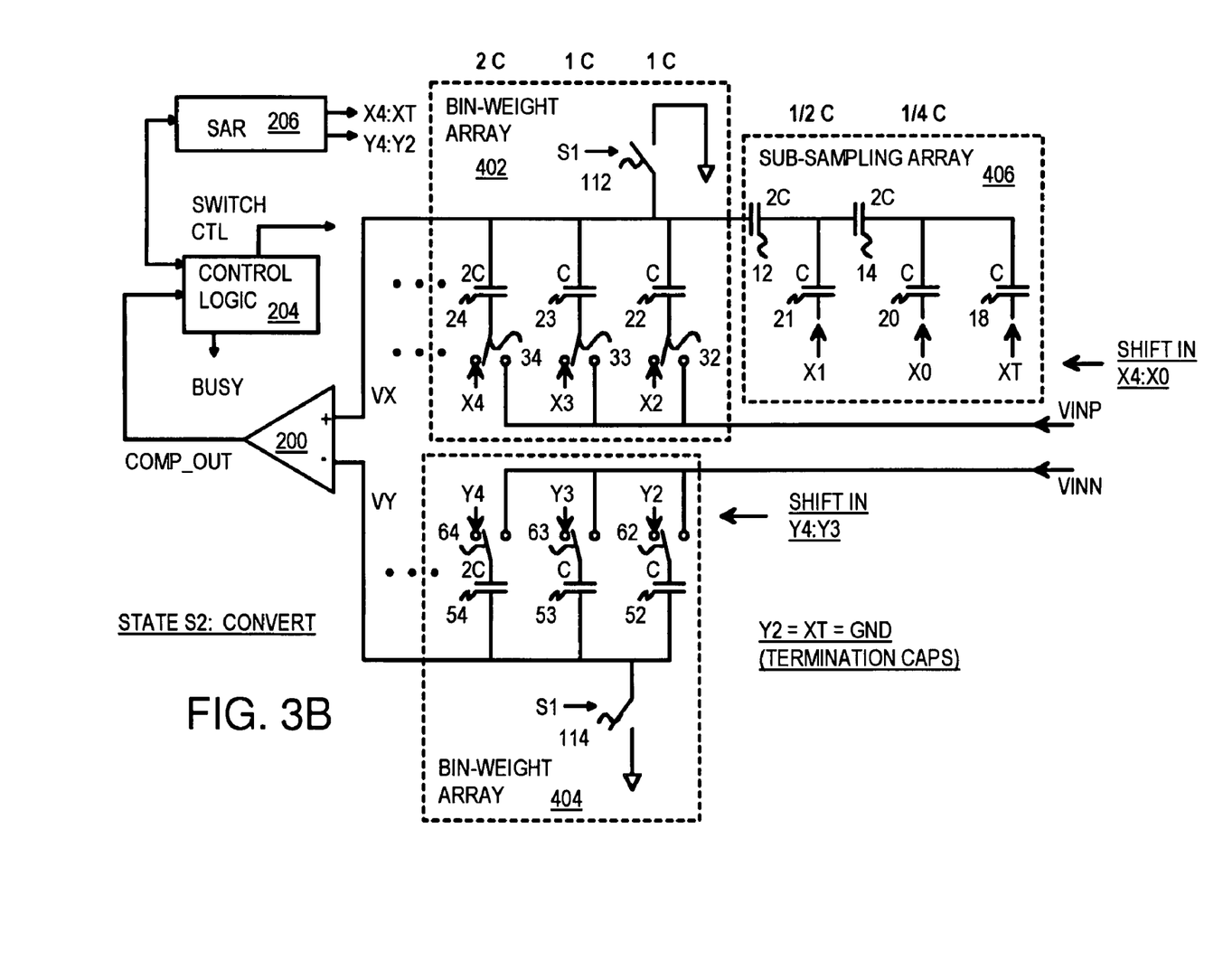

FIGS. 3A-B highlight operation of the SAR ADC with a reduced binary-weighted capacitor array and a sub-voltage capacitor array. Sampling phase S1 is shown in FIG. 3A while conversion phase S2 is shown in FIG. 3B.

In FIG. 3A, grounding switches 112, 114 are closed during sampling phase S1, grounding charge-sharing lines VX, VY. These lines could be equalized by a transistor or other switch between them if desired (not shown). The differential input VINP, VINN holds the analog voltage being converted to a digital value in SAR 206. VINP is applied through switches 32, 33, 34 to the bottom plates of capacitors 22, 23, 24, while VINN is applied through switches 62, 63, 64 to the bottom plates of capacitors 52, 53, 54 during sampling phase S1.

The sampled analog voltage VINP, VINP is only applied to binary-weighted capacitor arrays 402, 404. VINP is not applied to sub-voltage capacitor array 406. Instead, the bottom plates of sub-voltage capacitors 18, 20, 21 are grounded (or connected to VDD) during sampling phase S1. SAR 206 or control logic 204 can drive ground over X1, X0, XT during S1, or switches (not shown) may be used. The analog voltage VINP is stored as charge on capacitors 22, 23, 24 in binary-weighted capacitor array 402 during sampling phase S1.

The node between coupling capacitor 12 and second coupling capacitor 14 is left floating, as is the node between second coupling capacitor 14 and sub-voltage capacitors 18, 20. Floating these nodes reduces leakage that might occur from a switch or transistor if these nodes were connected during phase S2. Since these nodes are isolated by coupling capacitor 12, the exact voltage on these nodes is not important. Since X1, X0, XT are all grounded during phase S1, and node VX is also grounded, sub-voltage capacitor array 406 is effectively zeroed out during sampling phase S1. Any voltage offsets due to floating nodes are canceled out by the grounded lines.

During sampling, the smallest capacitors connected to sampled voltage VINP are capacitors 22, 23, with the minimum capacitor size C. The thermal noise of binary-weighted capacitor array 402 determines this minimum capacitor size. Since the number of binary bits applied to binary-weighted capacitor array 402 is reduced by increasing the bits applied to sub-voltage capacitor array 406, the thermal noise is close to the quantization noise, allowing C to be smaller than for a full-sized binary-weighted capacitor array. Half and quarter-sized capacitors are not needed, even though the effective resolution is one-quarter what would be normally supported by binary-weighted capacitor array 402 alone.

In FIG. 3B, during conversion phase S2, grounding switches 112, 114 are opened, floating nodes VX, VY and allowing their voltages to change as charge is shared. Switches 32, 33, 34 switch to disconnect VINP and connect binary bits X4, X3, X2 from SAR 206 to capacitors 24, 23, 22. Switches 62, 63, 64 switch to disconnect VINN and connect binary bits Y4, Y3, Y2 from SAR 206 to capacitors 54, 53, 52. Signals Y2 and XT are grounded so that capacitors 52, 18 act as termination capacitors. These signals Y2, XT could be generated by control logic 204 since they do not have to be stored as significant bits in SAR 206. LSB's X1, X0 from SAR 206 are applied to the bottom plates of sub-voltage capacitors 21, 20.

The high and low voltages of the binary values X4:X2 and Y4:Y3 cause charge to be moved or shared between capacitors attached to charge-sharing lines VX, VY. The voltages of VX, VY change in response to the binary values. The value in SAR 206 can be successively changed to test out digital values until a best match is found. For example, first the MSB can be set and all LSB's cleared to zero. When comparator 200 shows that VX is larger than VY, the analog voltage was overshot and the MSB can be cleared and the next MSB set and comparison repeated. When comparator 200 shows that VX is not greater than VY, then the MSB is left set and the next MSB tested. Successively lower significant bits are tested until the LSB is tested and the final value for SAR 206 is found.

When X1 is tested, the high or low voltage for X1 shifts charge from capacitor 21 to coupling capacitor 12. Since coupling capacitor 12 has double the capacitance of capacitors 21, 22, the amount of charge moved Q produces only half the voltage swing V on line VX, since Q=CV, or Q=2C*V/2. Thus binary bit X1 produces only a ½ voltage swing on line VX as does binary bit X2.

When X0 is tested, the high or low voltage for X0 shifts charge from capacitor 20 to second coupling capacitor 14. Since second coupling capacitor 14 has double the capacitance of capacitors 20, 21, 22, the amount of charge moved Q produces only half the voltage swing on the floating node between coupling capacitor 12 and second coupling capacitor 14, or V/2. Then coupling capacitor 12 further dilutes this voltage swing by another half, so that the amount of charge moved Q produces only one-quarter the voltage swing V on line VX. Thus binary bit X0 produces only a ¼ voltage swing on line VX as does binary bit X2.

Although the analog voltage VINP, VINN was sampled down to the resolution of X2 and Y2, during conversion the sampled voltages held on lines VX and VY are further resolved by two more bits, X1, X0, increasing the resolution by 2 more LSB's.

During sampling (FIG. 3A) the analog voltage VINP, VINN is applied only to binary-weighted capacitor arrays 402, 404, while during conversion (FIG. 3B) the digital value in SAR 206 is applied to both sub-voltage capacitor array 406 and binary-weighted capacitor arrays 402, 404.

Figure 4:
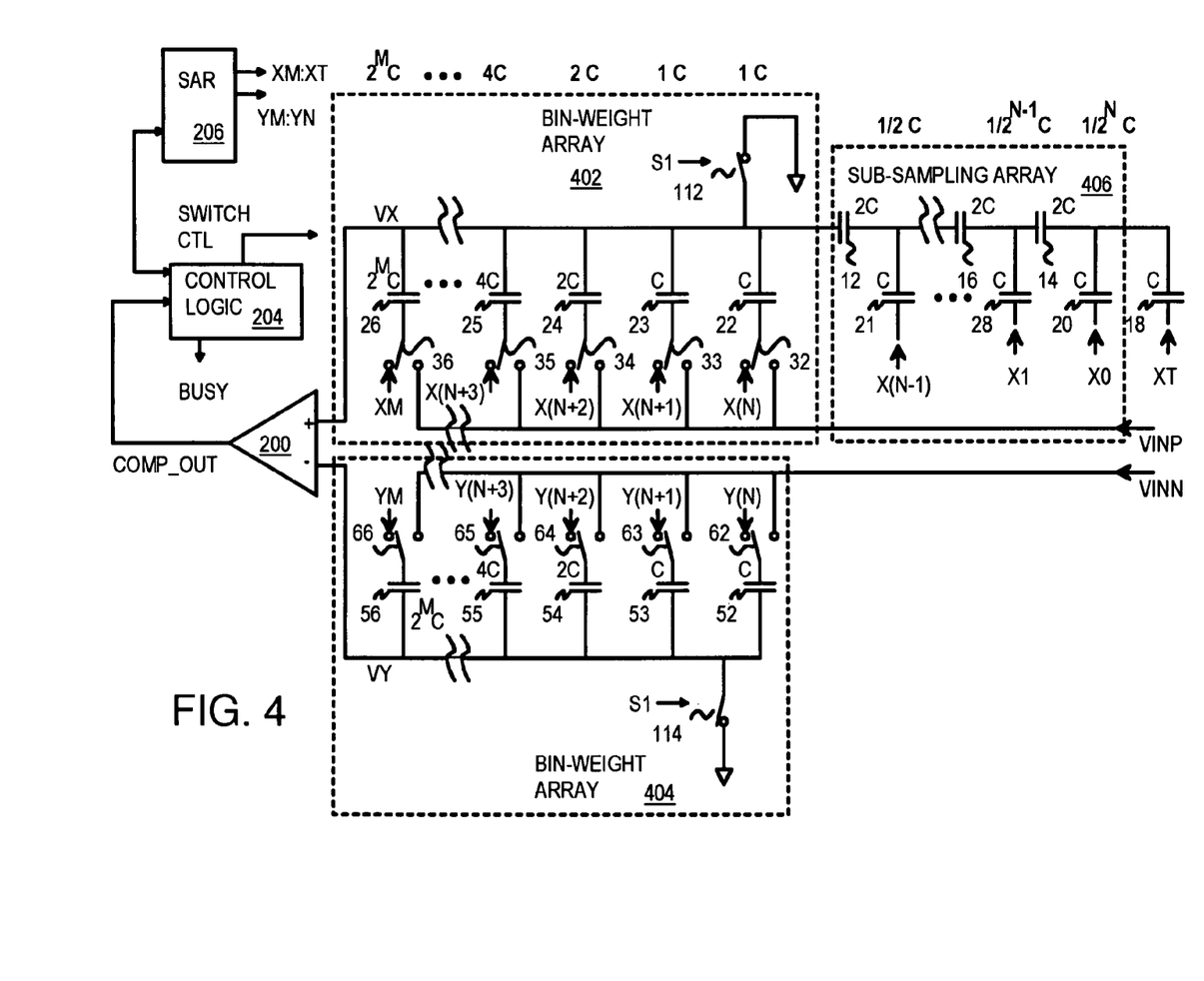
FIG. 4 shows a larger, more generalized SAR ADC with a reduced binary-weighted capacitor array and a sub-voltage capacitor array.

FIG. 4 shows a larger, more generalized SAR ADC with a reduced binary-weighted capacitor array and a sub-voltage capacitor array. SAR 206 stores M significant bits XM:X0 for an M-bit ADC. The lowest N bits are LSB's that are only applied to sub-voltage capacitor array 406 and not to binary-weighted capacitor arrays 402, 404.

The LSB, X0, controls an effective capacitance of $\frac{1}{2^N}$ C. For example, when N is 4, X3, X2, X1, X0 are applied to sub-voltage capacitor array 406 and X0 generates a voltage on node VX of only $\frac{1}{16}$ of that generated capacitors 22, 23. Note that capacitors produce the same voltage on VX even though they have different significant bits. This is so that voltage difference (VX-VY) can be adjusted by the LSBs, from X(N-1) to X(0), alone without adjustment of Y(N-1) ... Y(0).

The MSB's, from X(N) to X(M) are applied to switches 32, 33, 34, 35, 36 in binary-weighted capacitor array 402 and control binary-weighted capacitors 22, 23, 24, 25, 26 with capacitance values C, C, 2C, 4C, 8C, ... $2^M$C. Likewise, the MSB's, from Y(N) to Y(M) are applied to switches 62, 63, 64, 65, 66 in binary-weighted capacitor array 404 and control binary-weighted capacitors 52, 53, 54, 55, 56 with capacitance values C, C, 2C, 4C, 8C, ... $2^M$C.

When N is 6 and M is 12, six bits X5:X0 are applied to sub-voltage capacitor array 406, and six bits X11:X6 are applied to binary-weighted capacitor array 402. The resolution of the ADC is 12 bits, yet binary-weighted capacitor arrays 402, 404 are only 6-bit arrays. The size of capacitors in the binary-weighted capacitor arrays is greatly reduced, and dynamic power, die area and cost are also reduced.

Figure 5:
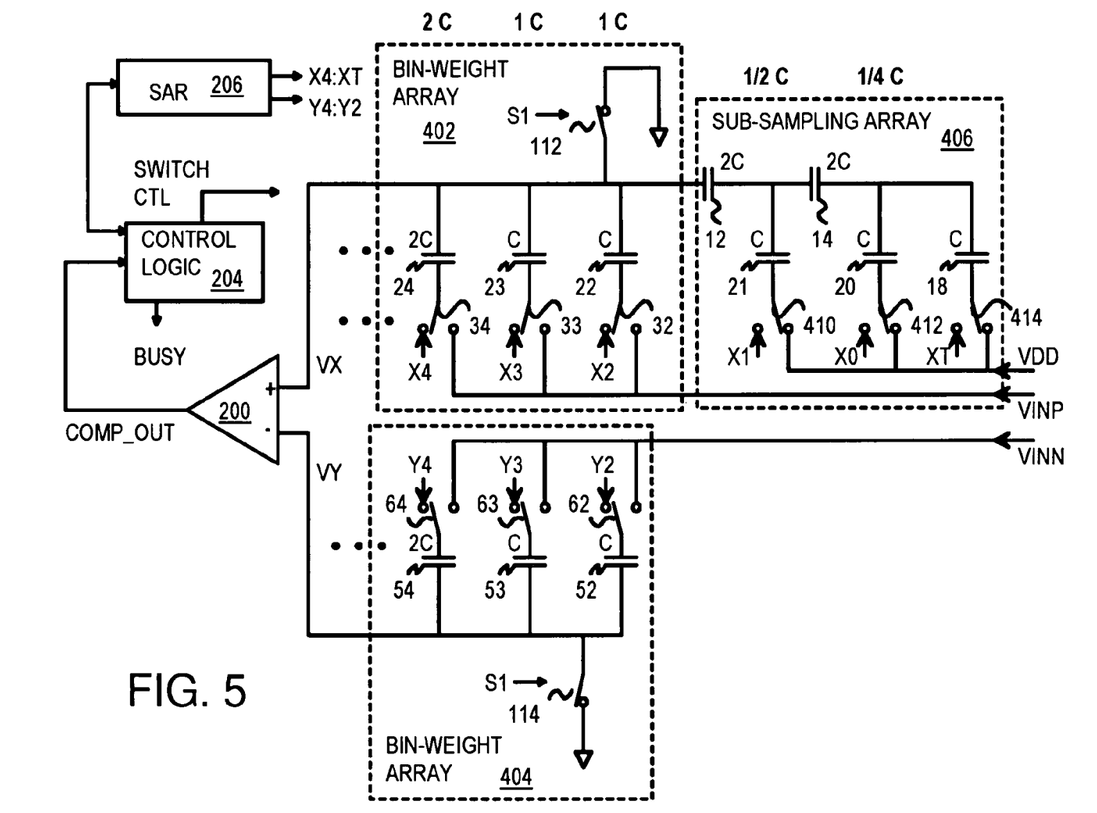
FIG. 5 is an alternate embodiment that precharges the capacitors in the sub-voltage capacitor array.

FIG. 5 is an alternate embodiment that precharges the capacitors in the sub-voltage capacitor array. Switches 410, 412, 414 switch power VDD to the bottom plates of sub-voltage capacitors 21, 20, 18 during sampling phase S1, and switch binary bits X1, X0 and signal XT during conversion phase S2. Signal XT can be grounded during conversion phase S2 to allow capacitor 18 to act as a termination capacitor. Precharging can shift the digital values to a range that produces more desirable codes, such as no negative numbers.

Figure 6:
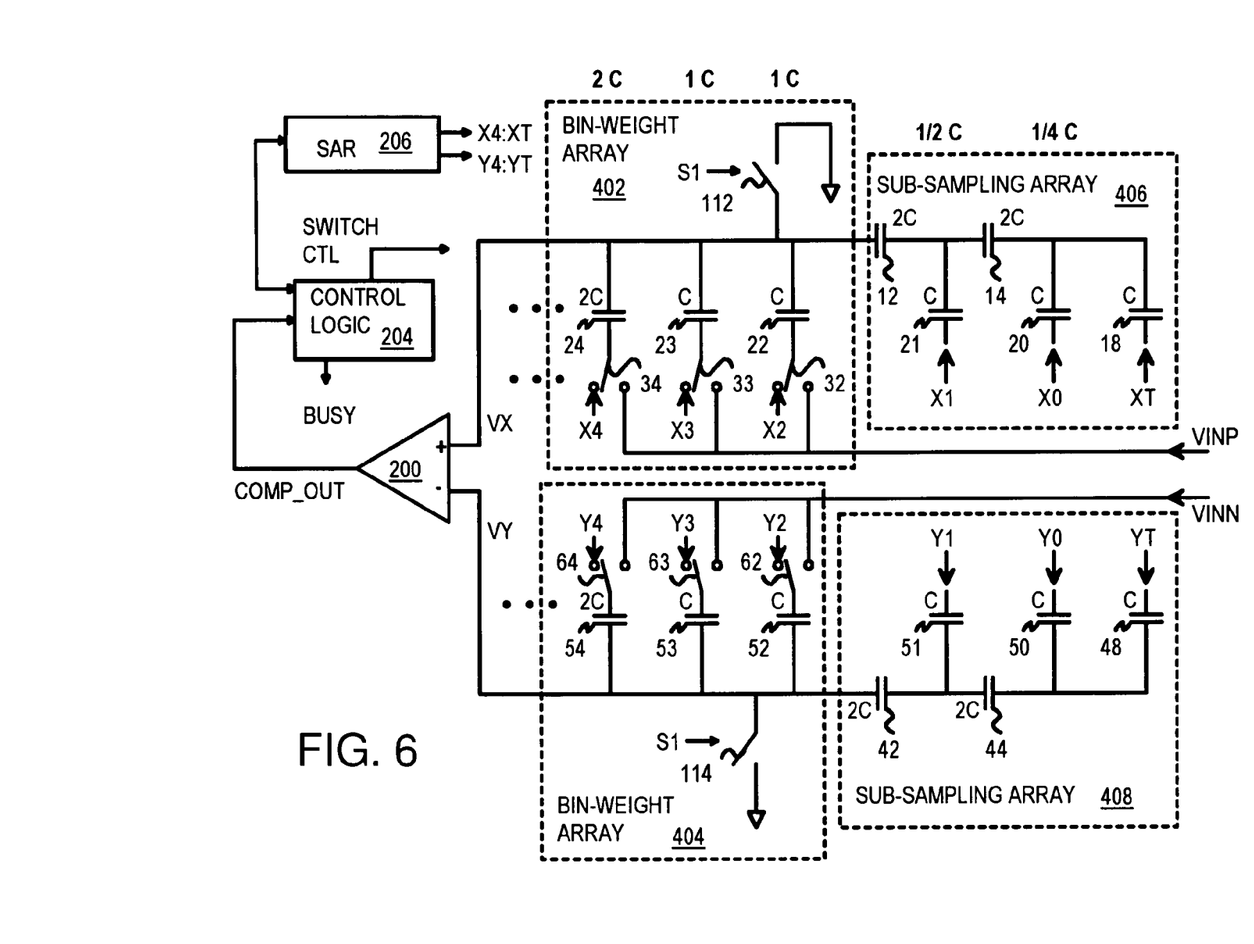
FIG. 6 is an alternate embodiment with complementary sub-voltage capacitor arrays.

FIG. 6 is an alternate embodiment with complementary sub-voltage capacitor arrays. Complement sub-voltage capacitor array 408 connects to complementary charge-sharing line VY through coupling capacitor 42. Complement sub-voltage capacitor array 408 operates in a manner similar to that of sub-voltage capacitor array 406, but receives binary bits Y1, Y0 and control signal YT from SAR 206 and/or control logic 204.

A calibration code Y1:YT can be stored in SAR 206 or in other logic and applied to binary-weighted capacitor array 404 and complement sub-voltage capacitor array 408 to provide a positive or negative voltage effect on VY. The calibration code can be determined by comparing a known analog voltage and adjusted as needed. Complement sub-voltage capacitor array 408 can act as a calibration DAC.

Mathematical Model for FIG. 6

During sampling phase S1, the charge QX−, QY− on lines VX, VY are:

$$Q_x^- = C_4(0-X_4^-) + C_3(0-X_3^-) + C_2(0-X_2^-)$$

$$Q_y^- = C_4(0-Y_4^-) + C_3(0-Y_3^-) + C_2(0-Y_2^-)$$

where C4, C3, C2 are the capacitances of capacitors 24, 23, 22, respectively, which are the same as the capacitances of capacitors 54, 53, 52, respectively. X4− is the voltage of X4, Y2− is the voltage of Y4, etc. during sampling phase S1.

During conversion phase S2, the charge QX+, QY+ on lines VX, VY are:

$$Q_x^+ = C_4(V_x - X_4^+) + C_3(V_x - X_3^+) + C_2(V_x - X_2^+) + C_{12}(V_x - V_{x1}^+)$$

$$Q_y^+ = C_4(V_y - Y_4^+) + C_3(V_y - Y_3^+) + C_2(V_y - Y_2^+) + C_{12}(V_y - V_{y1}^+)$$

The positive signs indicate phase S2 while the negative signs indicate phase S1. Node X1 is the node between coupling capacitor 12 and second coupling capacitor 14 and Y1 is the similar node between coupling capacitors 42, 44 (FIG. 6).

Using conservation of charge and combining, with Ceq being the 2C of coupling capacitor 12, and c1eq=c0eq=c0=c1=c2=c3=C; c4=2C:

$$Vx \times (c1eq + c4 + c3 + c2) = c4 \cdot X4 + c3 \cdot X3 + c2 \cdot X2 + \frac{c1_{eq} \cdot c1}{c1 + c0} \cdot X1 +$$
$$\frac{c1_{eq} \cdot c0_{eq}}{c1 + c0_{eq}} \cdot \frac{c0}{c0 + ct} \cdot X0 + \frac{c1_{eq} \cdot c0_{eq}}{c1 + c0_{eq}} \cdot \frac{ct}{c0 + ct} \cdot Xt - (c4 + c3 + c2)vinp$$

Y1, Y0, YT are referred to as R1, R0, Rt in the equations below.

$$Vy \times (c1eq + c4 + c3 + c2) = c4 \cdot Y4 + c3 \cdot Y3 + c2 \cdot Y2 + \frac{c1_{eq} \cdot c1}{c1 + c0} \cdot R1 +$$
$$\frac{c1_{eq} \cdot c0_{eq}}{c1 + c0_{eq}} \cdot \frac{c0}{c0 + ct} \cdot R0 + \frac{c1_{eq} \cdot c0_{eq}}{c1 + c0_{eq}} \cdot \frac{ct}{c0 + ct} \cdot Rt - (c4 + c3 + c2)vinn$$

For example, when c1eq=c0eq=c0=c1=c2=c3=C; c4=2C:

$$Vx \times (5) = 2 \cdot X4 + 1 \cdot X3 + 1 \cdot X2 + \frac{1}{2} \cdot X1 + \frac{1}{4} \cdot X0 + \frac{1}{4} \cdot Xt - (4)vinp$$

$$Vy \times (5) = 2 \cdot Y4 + 1 \cdot Y3 + 1 \cdot Y2 + \frac{1}{2} \cdot R1 + \frac{1}{4} \cdot R0 + \frac{1}{4} \cdot Rt - (4)vinn$$

Figure 7:
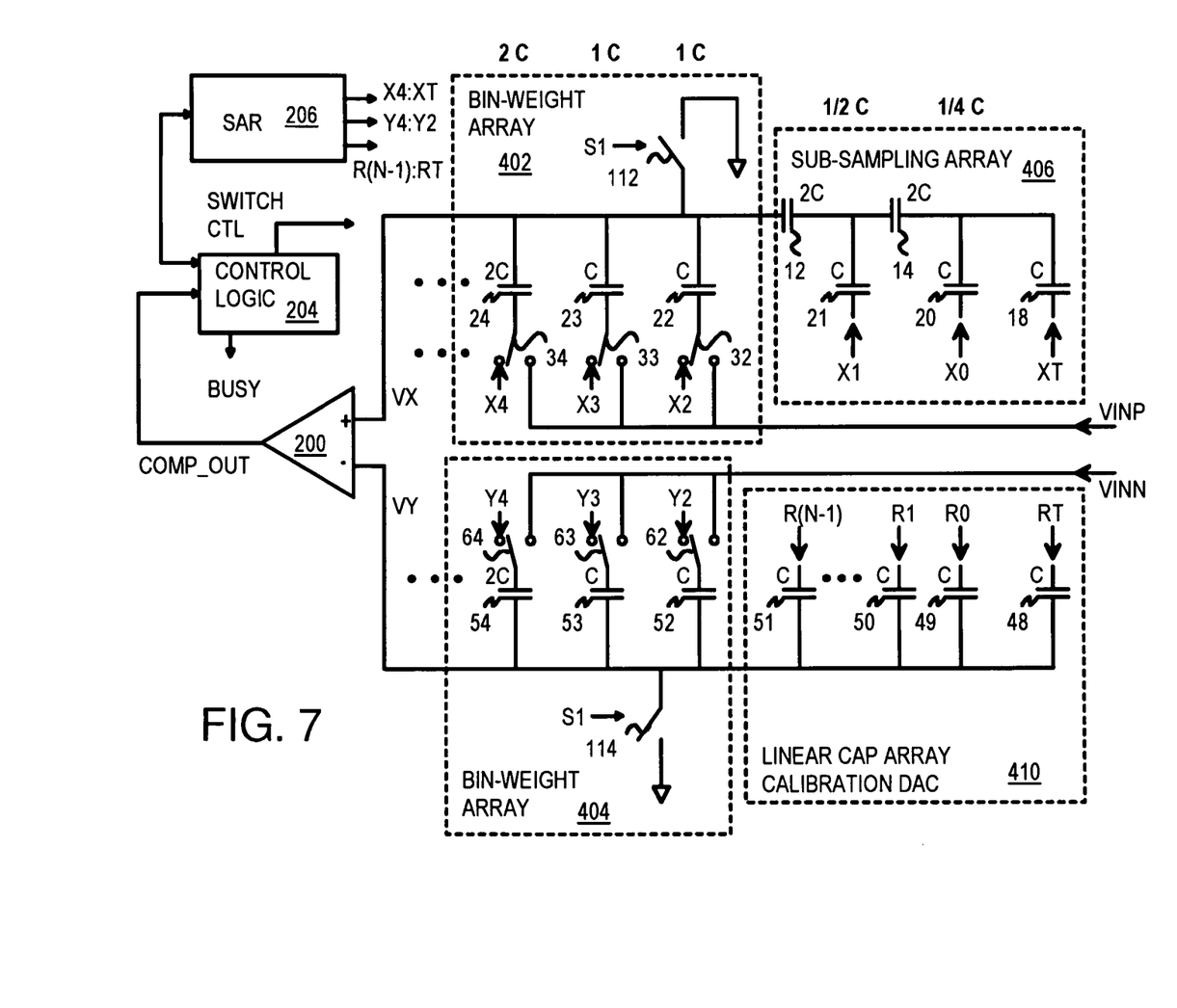
FIG. 7 is an alternative with a linear capacitor array for calibration.

FIG. 7 is an alternative with a linear capacitor array for calibration. Complement binary-weighted capacitor array 404 connects directly to linear capacitor array 410 along line VY without a coupling capacitor. Calibration capacitors 49, 50, 51 have the same minimum capacitor value C and have calibration values R0, R1, . . . R(N−1) applied. Calibration values may be stored in SAR 206 or in some other register. Capacitor 48 acts as the termination capacitor. A calibration value can be added directly to line VX by driving high or low voltages onto these calibration capacitors.

Figure 8:
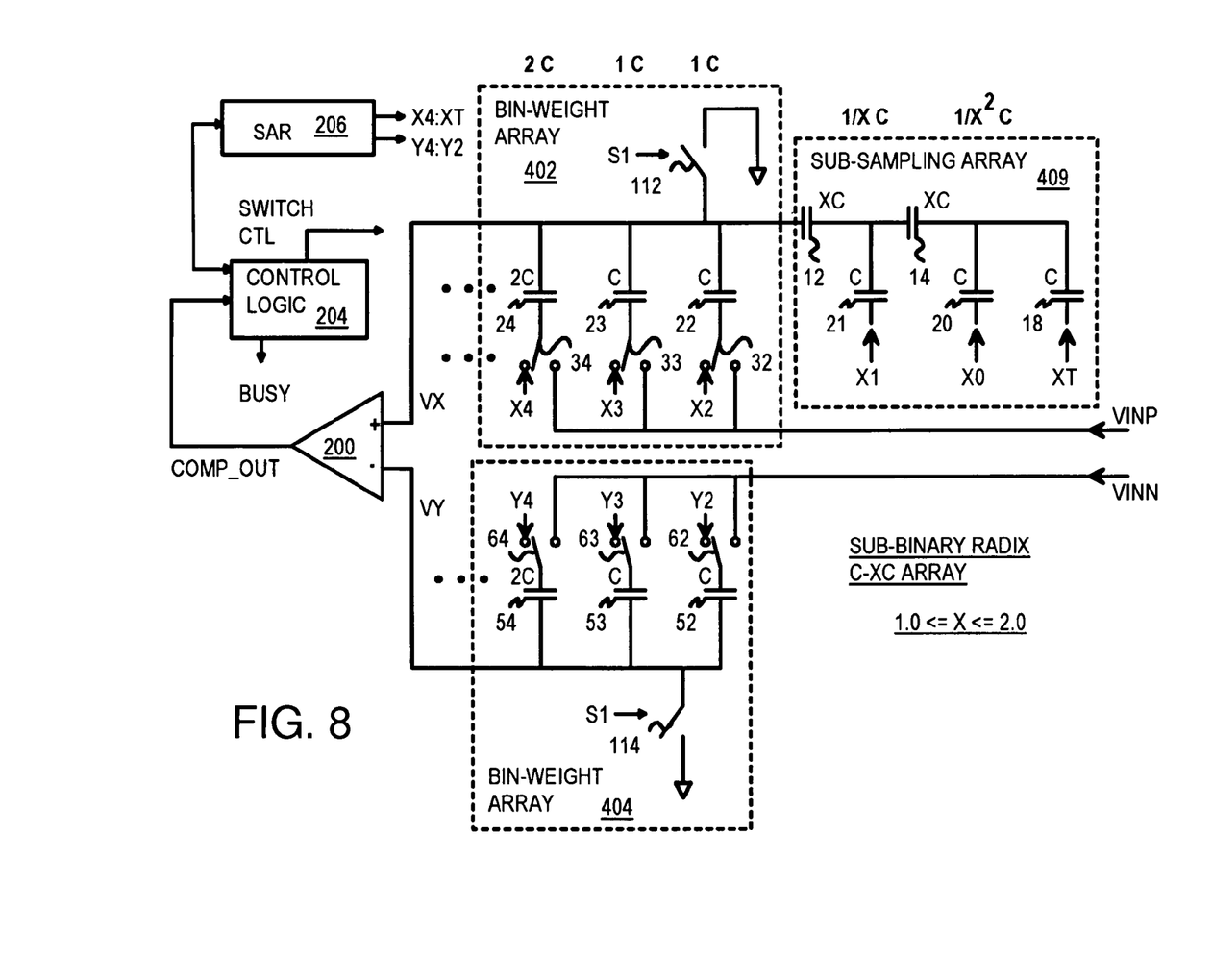
FIG. 8 is an alternative using a sub-binary radix for the sub-voltage capacitor array.

FIG. 8 is an alternative using a sub-binary radix for the sub-voltage capacitor array. The capacitance value of coupling capacitor 12 and of second coupling capacitor 14 is not 2 in this embodiment. Instead, the coupling capacitances are set to an intermediate value, such as 1.5 or 1.7 times the minimum capacitance C.

The voltage effect created on charge-sharing line VX by sub-voltage capacitor 21 is $1/X$, where X is between 1 and 2 and the capacitance of coupling capacitor 12 is XC.

The voltage effect created on charge-sharing line VX by sub-voltage capacitor 20 is $1/X^2$, where X is between 1 and 2 and the capacitance of coupling capacitor 12 and of second coupling capacitor 14 is XC. Using sub-binary radixes allows the designer to fine-tune the effect of sub-voltage capacitor array 409.

Alternate Embodiments

Several other embodiments are contemplated by the inventors. For example the binary-weighted capacitor array could be thermometer-weighted or use gray codes or some other weighting arrangement. The binary bit from SAR 206 (FIGS. 2-8) can be merged with other control or timing information, such as from control logic 204 or a sequencer or multi-phase non-overlapping clock. For example, a 16-bit binary value 10 . . . 010 causes a switch to connect a 32 KC capacitor to VDD, VREF, or some other high voltage, a next switch to connect a 16 KC capacitor to ground or some other low voltage, . . . a switch to connect a C capacitor 22 to ground. X1 connects C capacitor 21 to high, and X0 connects C capacitor 20 to ground.

The number of bits in the register value in SAR 206 can be adjusted to achieve the desired accuracy. For example, when N is 16 bits and VREF is 2 volts, the LSB represents 30 micro-volts, which is the precision of the ADC. A different number of bits could be substituted for a different precision, and the number of bits could be fixed or could be variable.

Some embodiments may not use all components. For example, switches may be added or deleted in some embodiments. Different kinds of switches may be used, such as 2-way switches or 3-way switches. Muxes may be used as switches. Input resistors could be added to VINP, VINN or more complex input filters used. Multiple levels of switches may be used, such as 2-way switches for switches, and then an overall switch that connects either VDD or GND to these 2-way switches.

While binary-weighted capacitors have been described, other weightings could be substituted, such as decimally-weighted capacitors, prime-weighted capacitors, or linearly-weighted capacitors, or octal-weighted capacitors. The digital value could be in these other number systems, such as octal numbers rather than binary numbers.

Inversions may be added by swapping inverting and non-inverting inputs as desired, but do not change the overall function and thus may be considered equivalents. The digital values that pass through the switches during the conversion phase could be applied directly to the switches as either data that passes through the switches or as control of the switches. More complex switches could use the digital values to generate high and low voltages that are applied to the capacitors by the complex switches. Other embodiments of connecting the digital values to the capacitors through the switches are possible.

The resistance and capacitance values may vary in different patterns. Capacitors, resistors, and other filter elements may be added. Switches could be n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes. Capacitors may be connected together in parallel to create larger capacitors that have the same fringing or perimeter effects across several capacitor sizes.

Comparison of a reference voltage to a single analog voltage could be used, or a differential analog voltage could be compared. The differential input voltage could be latched and then the latched single-ended voltage compared to the DAC voltage. The first voltage could be sampled by a capacitor; then the second voltage could be sampled by the same capacitor. The differential charge is stored on another capacitor through the feedback of the amplifier. Another method for comparing differential analog voltages is to put a differential amplifier at the input with a defined gain. While an operational amplifier (op amp) could be used, other kinds of comparators could be used, such as non-amplifying compare buffers.

Rather than have two arrays of binary-weighted capacitors, only one array may be used for the V+ line, along with a single voltage, such as ground or Vref, or a few capacitors on the V− line. The loading on the analog input lines VINP, VINN is reduced since the analog input is not applied to the LSBs resolved by sub-voltage capacitor array 406. The only load on the analog input is from binary-weighted capacitor arrays 402, 404.

An equalizing switch could be added between VX and VY. Two grounding switches could be used on the true and complement inputs lines of the inputs to comparator 200. Rather than grounding, some switches could connect to another fixed voltage, such as VDD or VDD/2.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A hybrid analog-to-digital converter (ADC) comprising:
   a first charge-sharing line;
   a plurality of first switches;
   a first array of capacitors having weighted capacitance values, wherein first array capacitors in the first array connect to the first charge-sharing line and to the plurality of first switches;
   a first analog input having an analog input voltage,
   a plurality of first digital values;
   wherein the plurality of first switches connect the first analog input to the first array of capacitors during a sampling phase;
   wherein the plurality of first switches connect the first digital values to the first array of capacitors during a conversion phase after the sampling phase;
   a sub-voltage capacitor array comprising:
      a first coupling capacitor connected between the first charge-sharing line and a first sub-sampling node, wherein charge is shared between the first array capacitors and the first coupling capacitor to generate a first compare voltage on the first charge sharing line;
      a first sub-sampling capacitor coupled between the first sub-sampling node and a first digital sub-value;
      a second coupling capacitor connected between the first sub-sampling node and a second sub-sampling node;
      a second sub-sampling capacitor coupled between the second sub-sampling node and a second digital sub-value;
   a comparator that receives the first compare voltage and compares the first compare voltage to a second comparator input to generate a compare output; and
   control logic for adjusting the first digital value to the plurality of switches during a first sequence of compare operations, and for examining the compare output from the comparator stage during the first sequence of compare operations to determine a first digital value that approximately represents the analog input voltage;
   the control logic further for adjusting the first digital sub-value and the second digital sub-value during a final sequence of compare operations after the first sequence of compare operations is completed, and for examining the compare output from the comparator stage during the final sequence of compare operations to determine a final digital value that represents the analog input voltage more precisely than the first digital value;
   wherein the final digital value comprises the first digital value as most-significant-bits (MSBs) and the first digital sub-value and the second digital sub-value as least-significant-bits (LSBs);
   whereby the final digital value is generated with MSBs generated from the first array of capacitors having weighted capacitance values that sample the first analog input, and with LSBs generated from the first and second sub-sampling capacitors and coupled through the first coupling capacitor that do not sample the first analog input.

2. The hybrid ADC of claim 1 further comprising:
   a Successive-Approximation-Register (SAR) that stores the first digital value, the first digital sub-value, and the second digital sub-value;
   wherein the control logic updates the first digital value in the SAR during the first sequence of compare operations;
      wherein the control logic updates the first digital sub-value and the second digital sub-value in the SAR during the final sequence of compare operations;
   wherein the SAR outputs the digital value, the first digital sub-value, and the second digital sub-value as the final digital value that represents the analog input voltage at an end of sequences of compare operations.

3. The hybrid ADC of claim 2 wherein the first sub-sampling capacitor and the second sub-sampling capacitor each have a minimum capacitance value;
   wherein a smallest capacitor in the first capacitor array has the minimum capacitance value;
   wherein the first coupling capacitor and the second coupling capacitor each have a coupling capacitance value that is larger than the minimum capacitance value.

4. The hybrid ADC of claim 3 wherein the coupling capacitance value is substantially double the minimum capacitance value.

5. The hybrid ADC of claim 3 wherein the coupling capacitance value is X times the minimum capacitance value, wherein X is between 2.0 and 1.0.

6. The hybrid ADC of claim 3 wherein the first array of capacitors comprises first array capacitors having binary-weighted capacitance values;
   wherein capacitance values of the first array capacitors are $1, 1, 2, 4, 8, \ldots 2^M$ times the minimum capacitance value, wherein M+2 is a whole number that indicates a number of first array capacitors in the first array of capacitors;
   wherein the final digital value has M+4 binary bits of significance.

7. The hybrid ADC of claim 6 further comprising:
a first grounding switch, activated during the sampling phase to connect the first charge-sharing line to ground.

8. The hybrid ADC of claim 7 wherein the first sub-sampling node is a floating node between capacitors that is not driven to ground;
wherein the second sub-sampling node is a floating node between capacitors that is not driven to ground,
whereby leakage is minimized by floating sub-sampling nodes.

9. The hybrid ADC of claim 6 further comprising:
a plurality of sub-switches, coupled to the first sub-sampling capacitor and to the second sub-sampling capacitor, for driving a fixed voltage onto the first and second sub-sampling capacitors during the sampling phase, and for driving the first digital sub-value to the first sub-sampling capacitor during the conversion phase, and for driving the second digital sub-value to the second sub-sampling capacitor during the conversion phase.

10. The hybrid ADC of claim 9 wherein the fixed voltage is ground or a power-supply voltage.

11. The hybrid ADC of claim 6 further comprising:
a terminal sub-sampling capacitor coupled between the second sub-sampling node and a first terminal control signal;
wherein the terminal sub-sampling capacitor has the minimum capacitance value.

12. The hybrid ADC of claim 6 further comprising:
a second charge-sharing line carrying a second compare voltage and connected to the second comparator input;
a second grounding switch, activated during the sampling phase to connect the second charge-sharing line to ground;
a plurality of second switches;
a second array of capacitors having weighted capacitance values, wherein second array capacitors in the second array connect to the second charge-sharing line and to the plurality of second switches;
a second analog input having a second analog input voltage,
a plurality of second digital values;
wherein the plurality of second switches connect the second analog input to the second array of capacitors during the sampling phase;
wherein the plurality of second switches connect the second digital values to the second array of capacitors during the conversion phase after the sampling phase,
wherein the second digital value are calibration values.

13. The hybrid ADC of claim 12 wherein the second analog input connects to a reference voltage, or wherein the first analog input and the second analog input connect to a differential analog input.

14. The hybrid ADC of claim 12 further comprising:
a linear capacitor array coupled to the second charge-sharing line, the linear capacitor array having a plurality of capacitors each having the minimum capacitance value and connected between a calibration bit and the second charge-sharing line.

15. The hybrid ADC of claim 12 further comprising:
a calibrating sub-voltage capacitor array coupled to the second charge-sharing line, the calibrating sub-voltage capacitor array having a same structure of coupling capacitors and sub-sampling capacitors as the sub-voltage capacitor array;
wherein the first digital sub-value and the second digital sub-value of the calibrating sub-voltage capacitor array are LSBs of a calibration value.

16. A sub-sampling Analog-to-Digital Converter (ADC) comprising:
a sub-voltage capacitor array comprising a plurality of sub-sample cells connected in series, each sub-sample cell comprising:
a floating node that is connected only to capacitors and not connected to transistors or switches;
a sub-sampling capacitor coupled to the floating node on a first plate, and receives a voltage controlled by a digital sub-value on a second plate during a conversion phase, and receives a fixed voltage on the second plate during a sampling phase and does not sample an analog input voltage;
a coupling capacitor coupled between the floating node of a current sub-sample cell and a next sub-sample cell, the coupling capacitor capacitive coupling together adjacent sub-sample cells;
wherein a capacitance value of the coupling capacitor is substantially twice a minimum capacitance value of the sub-sampling capacitor, wherein voltage swings on the floating node are reduced by half when passing through the coupling capacitor;
a first charge-sharing line connected to the coupling capacitor in a most-significant of the plurality of sub-sample cells in the sub-voltage capacitor array, the first charge-sharing line generating a first compare voltage;
a first grounding switch for grounding the first charge-sharing line during the sampling phase;
a binary-weighted capacitor array having a plurality of capacitors with first plates connected to the first charge-sharing line, wherein capacitance values of capacitors in the binary-weighted capacitor array increase by a factor of 2 and are representable as $2^i$ times C, wherein C is the minimum capacitance value and i is a whole number;
a first analog input;
a plurality of first switches that connect the first analog input to second plates of the plurality of capacitors in the binary-weighted capacitor array during the sampling phase, and connect digital values to the second plates during the conversion phase;
a Successive-Approximation-Register (SAR) that stores the digital values as most-significant-bits (MSBs) and stores the digital sub-values as least-significant-bits (LSBs), wherein the digital values are applied to the plurality of first switches to control the binary-weighted capacitor array and the digital sub-values are applied to the sub-sampling capacitors in the sub-voltage capacitor array during the conversion phase;
a comparator coupled to the first charge-sharing line, for comparing the first compare voltage to a second compare voltage to generate a compare output; and
a sequencer for adjusting the digital values and the digital sub-values in the SAR in response to the compare output to generate a final value that represents an analog voltage on the first analog input, the final value including the digital value and the digital sub-values.

17. The sub-sampling ADC of claim 16 wherein the sub-voltage capacitor array further comprises:
a terminal sub-sampling capacitor coupled to the floating node in a least-significant of the plurality of sub-sample cells in the sub-voltage capacitor array, the terminal sub-sampling capacitor having the minimum capacitance value and having a second plate that is grounded during the conversion phase.

18. The sub-sampling ADC of claim 16 further comprising:
a second charge-sharing line generating the second compare voltage;

a second grounding switch for grounding the second charge-sharing line during the sampling phase;

a second binary-weighted capacitor array having a plurality of capacitors with first plates connected to the second charge-sharing line, wherein capacitance values of capacitors in the second binary-weighted capacitor array increase by a factor of 2 and are representable as $2^i$ times C, wherein C is the minimum capacitance value and i is a whole number;

a second analog input;

a plurality of second switches that connect the second analog input to second plates of the plurality of capacitors in the second binary-weighted capacitor array during the sampling phase, and connect calibration values to the second plates during the conversion phase;

wherein the second charge-sharing line is connected to the comparator.

19. The sub-sampling ADC of claim 18 further comprising:

a second sub-voltage capacitor array comprising a plurality of sub-sample cells connected in series, each sub-sample cell comprising:
  a floating node that is connected only to capacitors and not connected to transistors or switches;
  a sub-sampling capacitor coupled to the floating node on a second plate, and receives a voltage controlled by a calibration sub-value on a second plate during a conversion phase, and receives a fixed voltage on the second plate during a sampling phase and does not sample the second analog input;
  a coupling capacitor coupled between the floating node of a current sub-sample cell and a next sub-sample cell, the coupling capacitor capacitively coupling together adjacent sub-sample cells;

wherein a capacitance value of the coupling capacitor is substantially twice a minimum capacitance value of the sub-sampling capacitor, wherein voltage swings on the floating node are reduced by half when passing through the coupling capacitor;

wherein the second charge-sharing line is connected to the coupling capacitor in a most-significant of the plurality of sub-sample cells in the second sub-voltage capacitor array, the second charge-sharing line generating the second compare voltage.

20. An Analog-to-Digital Converter (ADC) comprising:

Successive-Approximation-Register (SAR) means for storing a digital value of M+N+2 significant bits that represent an analog voltage;

wherein M and N are whole numbers;

first analog input means for receiving a first analog voltage;

first sharing node means for generating a first compare voltage;

first binary-weighted capacitor array means for switching charge to the first sharing node means in response to digital values from the SAR means that are applied to capacitors having capacitance values of $2^i$ times C, wherein C is a minimum capacitance value and i is a whole number between 0 and M;

first switch means for connecting the first analog input means to capacitors in the first binary-weighted capacitor array means during a sampling phase, and for connecting M+2 digital values from the SAR means to capacitors in the first binary-weighted capacitor array means during a conversion phase after the sampling phase;

wherein the first binary-weighted capacitor array means comprises two capacitors each having the minimum capacitance value but controlled by different significant bits from the SAR means;

sub-voltage capacitor array means for adjusting the first compare voltage on the first sharing node means without sampling the first analog input means, the sub-voltage capacitor array means comprising a plurality of sub-sample cells connected in series, each sub-sample cell comprising:
  a floating node that is connected only to capacitors and not connected to transistors or switches;
  a sub-sampling capacitor coupled to the floating node on a first plate, and receives a voltage controlled by a digital sub-value on a second plate during the conversion phase, and receives a fixed voltage on the second plate during the sampling phase and does not sample an analog input voltage;
  a coupling capacitor coupled between the floating node of a current sub-sample cell and a next sub-sample cell, the coupling capacitor capacitively coupling together adjacent sub-sample cells;
  wherein a capacitance value of the coupling capacitor is substantially twice the minimum capacitance value C, wherein voltage swings on the floating node are reduced by half when passing through the coupling capacitor;

wherein the first sharing node means is connected to the coupling capacitor in a most-significant of the plurality of sub-sample cells in the sub-voltage capacitor array means;

wherein the sub-voltage capacitor array means receives N least-significant bits stored in the SAR means as the digital sub-values;

first grounding switch means for grounding the first sharing node means during the sampling phase;

second analog input means for receiving a second analog voltage;

second sharing node means for generating a second compare voltage;

second binary-weighted capacitor array means for switching charge to the second sharing node means in response to calibration values that are applied to capacitors having capacitance values of $2^i$ times C, wherein C is the minimum capacitance value and i is a whole number between 0 and M;

second switch means for connecting the second analog input means to capacitors in the second binary-weighted capacitor array means during the sampling phase, and for connecting calibration values to capacitors in the second binary-weighted capacitor array means during the conversion phase after the sampling phase;

wherein the second binary-weighted capacitor array means comprises two capacitors each having the minimum capacitance value but controlled by different significant calibration bits;

compare means for comparing the first compare voltage to the second compare voltage to generate a compare output; and sequencing means for adjusting the digital value stored in the SAR means in response to the compare output;

wherein M+2 most-significant bits from the SAR means are applied to the first switch means to control charge sharing from capacitors in the first binary-weighted capacitor array means;

wherein N least-significant bits from the SAR means are applied to the sub-voltage capacitor array means.

* * * * *